Figure 1A:
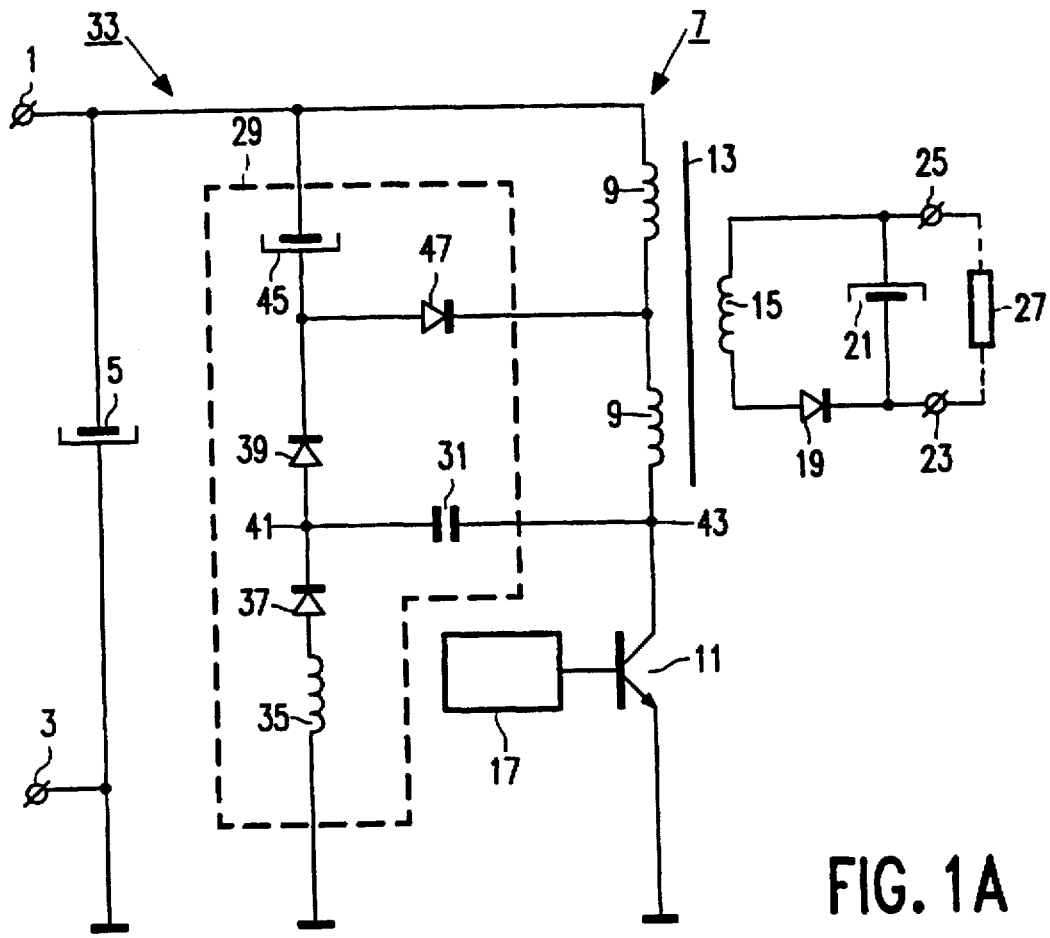

United States Patent [19]

Marinus et al.

[11] Patent Number: 5,708,575
[45] Date of Patent: Jan. 13, 1998

[54] POWER SUPPLY APPARATUS COMPRISING AN IMPROVED LIMITER CIRCUIT

[75] Inventors: Antonius A.M. Marinus; Patrick E.G. Smeets, both of Eindhoven, Netherlands

[73] Assignee: U.S. Philips Corporation, New York, N.Y.

[21] Appl. No.: 647,390

[22] Filed: May 9, 1996

[30] Foreign Application Priority Data

May 10, 1995 [EP] European Pat. Off. ............ 95201200.3

[51] Int. Cl.$^6$ ........................................... H02H 7/122
[52] U.S. Cl. ................................... 363/56; 363/21
[58] Field of Search .............................. 363/20, 21, 56

[56] References Cited

U.S. PATENT DOCUMENTS

| | | | |
|---|---|---|---|
| 4,312,029 | 1/1982 | Zellmer | 363/21 |
| 4,365,171 | 12/1982 | Archer | 307/253 |
| 4,709,316 | 11/1987 | Ngo et al. | 363/21 |
| 4,783,727 | 11/1988 | Neumann | 363/20 |
| 5,117,347 | 5/1992 | Rebello et al. | 363/56 |
| 5,126,931 | 6/1992 | Jitaru | 363/21 |
| 5,231,563 | 7/1993 | Jitaru | 363/98 |
| 5,260,607 | 11/1993 | Kinbara | 363/56 |
| 5,394,017 | 2/1995 | Catano et al. | 363/21 |
| 5,548,503 | 8/1996 | Motonobu et al. | 363/56 |

FOREIGN PATENT DOCUMENTS 0283856 9/1988 European Pat. Off. ....... H03K 17/08

OTHER PUBLICATIONS

"Elektronik Industrie 1" (1986), pp. 44, 46, 48.

*Primary Examiner*—Stuart N. Hecker
*Attorney, Agent, or Firm*—Edward Blocker

[57] ABSTRACT

The power supply apparatus serves to convert an electric direct voltage, acting as an input voltage, into an output voltage and comprises positive and negative input terminals (1, 3) which are arranged to receive the input voltage. The power supply apparatus also comprises a first series connection (7) of, at least a first coil (9) and a controllable switching element (11), which series connection interconnects the input terminals (1, 3), and a limiter circuit (29) which comprises a first capacitor (31) and a second series connection (33) of at least a second coil (35), a first rectifier element (37) and a second rectifier element (39), said second series connection being connected parallel to the first series connection in such a manner that the cathodes of the first and second rectifier elements are oriented towards the positive input terminal (1), one electrode of the first capacitor being connected to the anode of the second rectifier element and its other electrode to the junction (43) of the first coil and the switching element. The second series connection (33) also comprises an auxiliary voltage source (55) which is arranged to supply a direct voltage amounting to approximately half the input voltage and whose positive pole is oriented towards the positive input terminal (1). The presence of the auxiliary voltage source (55) prevents that upon switching off of the switching element (11) a voltage jump occurs across the switching element, which jump could cause an undesirably high energy dissipation in the switching element and also a disturbance (EMI).

4 Claims, 4 Drawing Sheets

POWER SUPPLY APPARATUS COMPRISING AN IMPROVED LIMITER CIRCUIT

The invention relates to a power supply apparatus for converting an electric direct voltage, acting as an input voltage, into an output voltage, comprising positive and negative input terminals which are arranged to receive the input voltage, a first series connection of at least a first coil and a controllable switching element, which series connection interconnects the input terminals, and a limiter circuit which comprises a first capacitor and a second series connection of at least a second coil, a first rectifier element and a second rectifier element, which second series connection is connected parallel to the first series connection in such a manner that the cathodes of the first and second rectifier elements are oriented towards the positive input terminal, an electrode of the first capacitor being connected to the anode of the second rectifier element whereas the other electrode is connected to the junction of the first coil and the switching element.

An apparatus of this kind is known, for example from Elektronik Industrie 1 (1986), pages 44, 46, 48, notably FIG. 5. The limiter circuit serves to prevent an very fast increase of the voltage across the switching element immediately after switching off. After the opening of the switching element, the magnetic energy stored in the first coil is used in the first instance to charge the first capacitor via the second rectifier element. When the first capacitor has been charged to such an extent that the voltage across the switching element reaches a value which is no longer negligibly small, the current through the switching element has meanwhile decreased to such an extent that no or hardly any power is dissipated in the switching element. The electric charge stored in the first capacitor is subsequently returned to the source of the input voltage or is applied to a load connected to the output terminals. After the closing of the switching element, the polarity of the charge of the first capacitor is reversed via this switching element, the first rectifier element and the second coil. In the most favourable case the voltage across the switching element should have to be equal to zero after the reversal of the polarity of the capacitor voltage, and should commence exactly at zero upon switching off. However, it may occur that a voltage jump occurs across the switching element upon switching off, which jump leads to dissipation and disturbances (EMI).

It is an object of the invention to improve a power supply apparatus of the kind set forth in such a manner that a voltage jump can no longer occur when the switching element is switched off. To this end, the power supply apparatus in accordance with the invention is characterized in that the second series connection also comprises an auxiliary voltage source which is arranged to supply a direct voltage amounting to approximately half the input voltage, its positive pole being oriented towards the positive input terminal. It can be demonstrated, both theoretically and practically, that as a result of this step voltage jumps no longer occur across the switching element. The auxiliary voltage source is preferably situated at one of the two extremities of the second series connection.

Various possibilities exist as regards practical implementation of the auxiliary voltage source. A first embodiment is characterized in that the auxiliary voltage source comprises a second capacitor which is connected between the cathode of the second rectifier element and the positive input terminal, the electrode of said second capacitor which is connected to the cathode of the second rectifier element also being connected to the anode of a third rectifier element whose cathode is connected to a tap of the first coil which is situated approximately halfway the first coil. A second embodiment is characterized in that the auxiliary voltage source comprises a third coil which is connected between the negative input terminal and the second coil and which is magnetically coupled to the first coil in such a manner that a voltage pulse of given polarity, relative to the input terminals, in the first coil induces a voltage pulse of the same polarity in the third coil, the number of turns of the third coil amounting to approximately half the number of turns of the first coil. The construction of these two embodiments is simple, uses few additional parts, and hence is inexpensive.

These and other aspects of the invention will be apparent from and elucidated with reference to the embodiments described hereinafter.

Figure 1B:
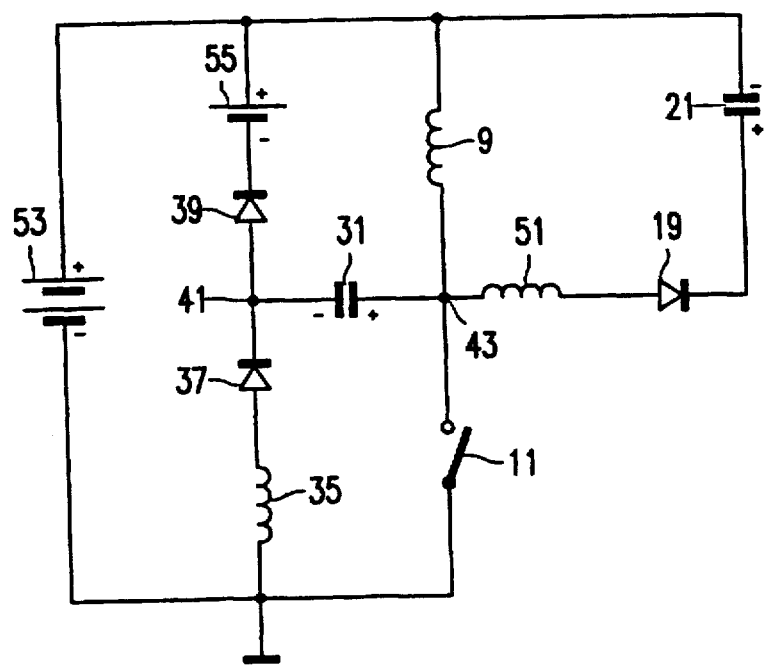
Figure 2:
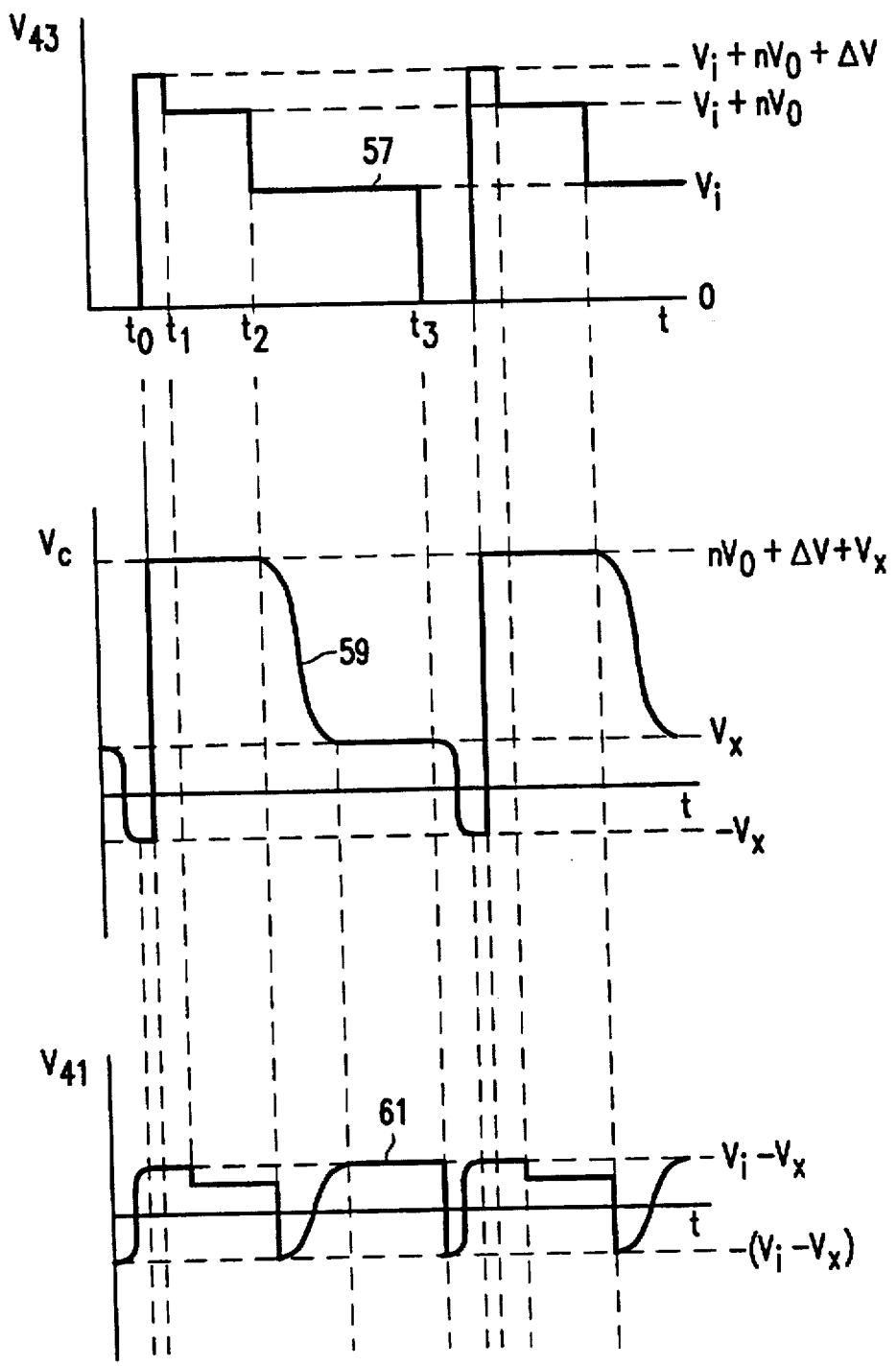
Figure 3A:
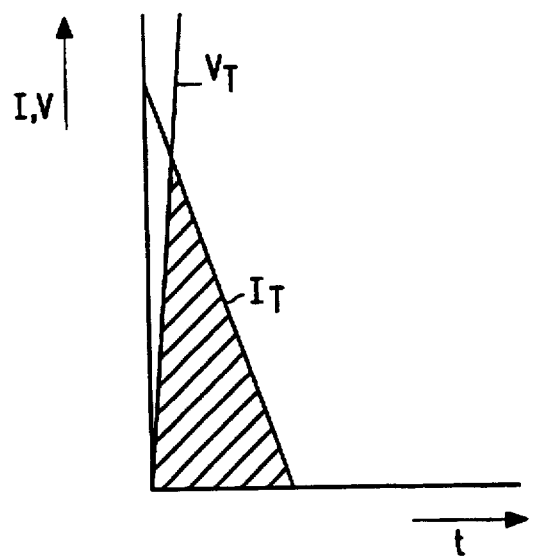
Figure 3B:
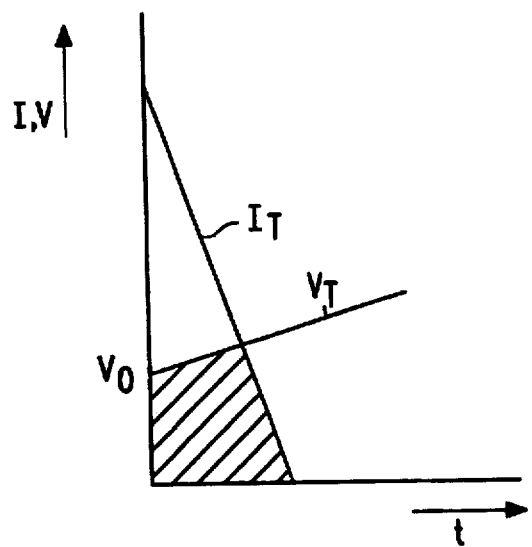
Figure 3C:
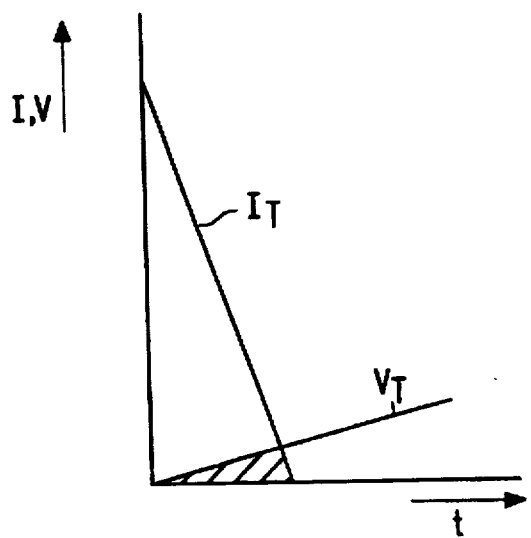
Figure 4A:
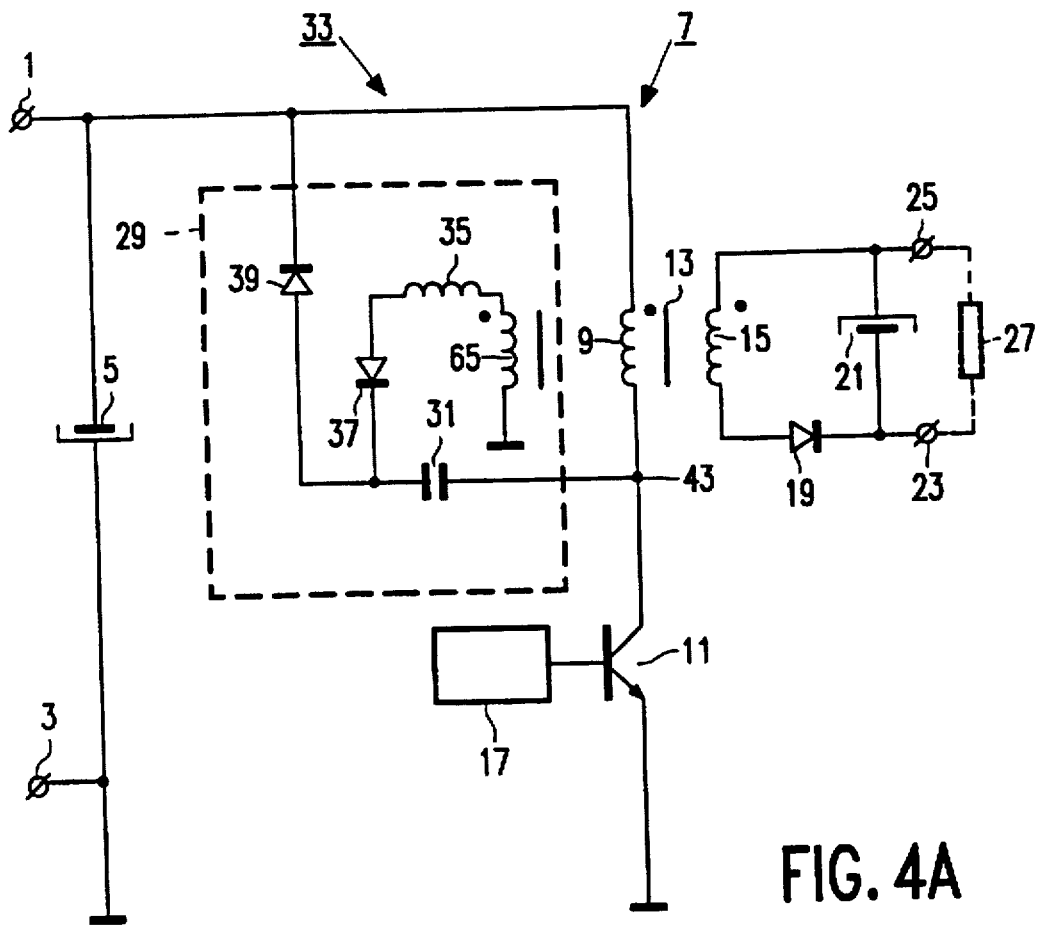
Figure 4B:
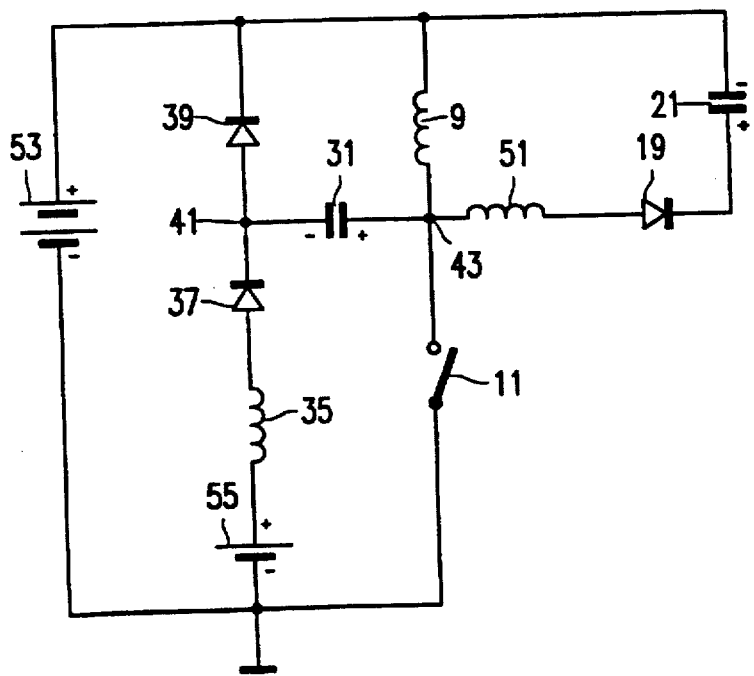

In the drawings:

FIGS. 1A and 1B show a schematic diagram and an associated circuit diagram, respectively, of a first embodiment of a power supply apparatus in accordance with the invention, FIG. 2 shows the variation as a function of time of a number of voltages in the circuit shown in FIG. 1, FIGS. 3A, 3B and 3C show some diagrams illustrating the operation of the power supply apparatus in accordance with the invention, and FIGS. 4A and 4B show a schematic diagram and an associated circuit diagram, respectively, of a second embodiment of a power supply apparatus in accordance with the invention.

The power supply apparatus shown in FIG. 1A, whose circuit diagram is shown in FIG. 1B, comprises a positive input terminal 1 and a negative input terminal 3 whereto an electric direct voltage can be applied from, for example a battery or a mains rectifier (not shown). An input capacitor 5, arranged between the input terminals 1, 3, serves to smooth a ripple voltage, if any. Furthermore, the input terminals 1,3 are interconnected via a first series connection 7 which in this case consists of a first coil 9 and a controllable switching element 11. The first coil 9 is the primary coil of a transformer 13 which also comprises a secondary coil 15. In the present embodiment the controllable switching element 11 is formed by a bipolar transistor of the NPN type. Evidently, other known switching elements, for example PNP transistors or MOSFETs, can also be used. A control circuit 17 serves for the periodic supply of switching pulses to a control electrode of the switching element 11 in order to set the latter alternately .to an electrically conductive and an electrically non-conductive state. The secondary coil 15 of the transformer 13 is connected in series with a diode 19 and an output capacitor 21. The output capacitor 21 is connected to a positive output terminal 23 and a negative output terminal 25 whereto a load 27 (denoted by dashed lines) can be connected.

The power supply apparatus also comprises a limiter circuit 29 which comprises a first capacitor 31 and a second series connection 33 which comprises inter alia a second coil 35, a first rectifier element 37 and a second rectifier element 39. The second series connection 33 is connected parallel to the first series connection 7 in such a manner that the cathodes of the first and second rectifier elements 37, 39 are oriented towards the positive input terminal 1. An electrode of the first capacitor 31 is connected to the anode of the second rectifier element 39. The anode of the second rectifier element 39 in the present embodiment is also connected to the cathode of the first rectifier element 37, the junction being denoted by the reference numeral 41. However, it is alternatively possible to interchange the positions of the second coil 35 and the first rectifier element 37. The other electrode of the first capacitor 31 is connected to the junction 43 of the first coil 9 and the switching element 11. The power supply apparatus described thus far is identical to known power supply apparatus, for example the power supply apparatus mentioned in the preamble. The circuit shown in FIG. 1 deviates from the known circuit, however, in that the second series connection 33 also includes an auxiliary voltage source which is formed by a second capacitor 45 which is connected between the cathode of the second rectifier element 39 and the positive input terminal and whose electrode which is connected to the cathode of the second rectifier element is also connected, via a third rectifier element 47, to a tap 49 of the first coil 9. The third rectifier element 47 is oriented so that its anode is connected to the second capacitor 45.

In the circuit diagram of FIG. 1B the transformer 13 is shown as a combination of the primary coil 9 and a distributed inductance 51. The combination of the input capacitor 5 with the voltage source connected to the input terminals 1, 3 is shown as a power supply battery 53 and the auxiliary voltage source formed by the second capacitor 45, the third rectifier element 47 and the tapping 49 is shown as an auxiliary battery 55.

The power supply apparatus shown operates mainly as follows. When the switching element 11 becomes electrically conductive, a current starts to flow from the positive input terminal 1, via the first coil 9 and the switching element 11, to the negative input terminal 3. As a result, magnetic energy is stored in the transformer 13. When the switching element 11 is opened, this energy produces a current in the secondary coil 15, which current charges, via the diode 19, the output capacitor 21 and feeds the load 27. Because the current through the primary coil 9 decreases only slowly after the opening of the switching element 11, the voltage at the junction 43 of this coil and the switching element would increase very rapidly if no further steps were taken. Because the current in the switching element 11 decreases only slowly after the switching element has been switched off, much energy would be dissipated in the switching element so that it could be seriously damaged. Moreover, the voltage jump occurring across the switching element 11 could cause a disturbance (EMI). These drawbacks are avoided in that the current in the first coil 9 can be drained via the first capacitor 31 and the second rectifier element 39. Energy is then stored in the first capacitor 31.

The operation of the circuit will be described in more detail with reference to FIG. 2. Therein, the following symbols are used:

$V_i$: the input voltage (the voltage across the power supply battery 53)

$V_o$: the output voltage (the voltage across the output capacitor 21)

n: the transformation ratio of the transformer 13

$V_C$: the voltage across the first capacitor 31

$V_x$: the voltage across the auxiliary battery 55

$V_{41}$ and $V_{43}$: the voltages at the junctions 41 and 43

$\Delta V$: the voltage across the distributed inductance 51.

Whenever necessary, the polarity of these voltages is denoted by the symbols + and − near the relevant parts in FIG. 1B. FIG. 2 shows successively three curves 57, 59 and 61 which denote the variation of the voltages $V_{43}$, $V_C$, and $V_{41}$, respectively, as a function of time t.

The maximum amount of energy stored in the first capacitor 31 when the switching element 11 opens is dependent on the output voltage $V_o$ and on the energy in the distributed inductance 51 of the transformer 13. As soon as the maximum amount of energy has been stored in the first capacitor 31, the second rectifier element 39 will prevent the energy from decreasing. Immediately after the opening of the switching element 11 (at the instant $t_0$), the voltage at the junction 43 (see the curve 57 in FIG. 2) equals the sum of the input voltage $V_i$, the value of the output voltage $nV_o$ transformed to the primary side of the transformer 13, and the voltage $\Delta V$ across the distributed inductance 51. After the demagnetization phase (instant $t_1$), this voltage has decreased to $V_i + nV_o$ and after the transfer of the energy present in the first coil 9 to the load 27 (instant $t_2$), $V_{43}$ has decreased further to $V_i$. After the dead time (instant $t_3$), the switching element 11 is closed again and $V_{43}$ decreases to zero. The voltage at the junction 41 at the most equals $V_i + V_x$ because as soon as this voltage becomes higher, the second rectifier element 39 starts to conduct (see the curve 61 in FIG. 2). The voltage $V_C$ across the first capacitor 31 thus becomes equal to $V_{43} - V_{41} = V_i - V_x$ at the instant $t_0$ (see the curve 59 in FIG. 2). The voltage across the first capacitor 31 subsequently remains constant until this capacitor can discharge. As a result, the voltage jumps at the junction 43 will also cause voltage jumps at the point 41. As soon as the voltage at the point 41 becomes negative, the first rectifier element 37 will become conductive. Depending on the instantaneous phase of the circuit, an oscillatory circuit with at least the first capacitor 31 and the second coil 35 is formed. During the demagnetization (until $t_1$) energy is applied forwards to the output and during the demagnetization phase and the dead time (until $t_3$) energy is returned to the input. In the case of discontinuous operation, so that a dead time occurs after $t_2$ until the switching element 11 is closed at the instant $t_3$, the voltage across the switching element equals $V_i$ just before closing. This is the situation shown in FIG. 2. It is also possible to operate continuously and to close the switching element 11 shortly after the demagnetization, so between $t_1$ and $t_2$. In that case $V_{43}$ equals $V_i + nV_o$ just before closing. In any case $V_{43}$, at least equals $V_i$ just before the closing of the switching element 11. $V_{41}$ is at the most equal to $V_i - V_x$, so that the voltage across the first capacitor 31 at least equals:

$$V_C = V_{43} - V_{41} = V_i - (V_i - V_x) = V_x \qquad (1)$$

After the closing of the switching element 11, the polarity of the voltage across the first capacitor 31 will be reversed. This means that the voltage across the first capacitor 31 equals $-V_x$ when the switching element 11 is opened. The voltage jump then occurring across the switching element 11 equals:

$$V_{43} = V_{41} + V_C = V_i - V_x + V_C = V_i - 2V_x \qquad (2)$$

It follows from (2) that the voltage across the switching element 11 can be made equal to zero by choosing $V_x$ equal to ½$V_i$. Because a part of the current $I_p$ in the first coil 9 in the first instance flows via the first capacitor 31 after the opening of the switching element 11, the voltage $V_T$ across the switching element 11 will increase only comparatively slowly, whereas the current $I_T$ through the switching element will decrease comparatively quickly. It is advantageous when the voltage across the switching element 11 commences at zero as will be illustrated hereinafter with reference to FIG. 3.

FIG. 3 shows the variation of the current $I_T$ and the voltage $V_T$ for three cases, immediately after the opening of the switching element 11; herein, t=0 corresponds to the instant of opening. FIG. 3A shows the situation in which no limiter circuit 29 is present. In that case $V_T$ very quickly increases immediately after the opening of the switching element 11 whereas the current $I_T$ has only just started to decrease. During the time that the current and the voltage are both larger than zero, energy is dissipated in the switching element 11. The amount of energy dissipated is proportional to the shaded surface area in the Figure. FIG. 3B shows the situation arising in the presence of a limiter circuit 29 but in the absence of the auxiliary voltage source 55, as in a known circuit, or when it has a value substantially smaller than ½$V_i$. As from t=0 $V_T$ then increases substantially more slowly than in FIG. 3A, which is due to the fact that the current $I_p$ is partly drained to the first capacitor 31. Upon switching off $V_T$, however, performs a jump whose magnitude is denoted by $V_O$ in FIG. 3B. It appears from (2) that this jump cannot be greater than $V_i$. The shaded surface area, being a measure of the energy dissipation, is smaller than in FIG. 3A but not yet optimum. FIG. 3C shows the situation which is reached in the circuit shown in FIG. 1. The jump $V_o$ has completely disappeared so that the shaded surface area has become negligibly small.

In the diagram shown in FIG. 1B the input voltage $V_i$ as well as the auxiliary voltage $V_x$ originates from batteries. This is a suitable solution in the case of power supply apparatus which must operate independently of an electric mains. However, if the apparatus is connected to an electric mains, a mains voltage rectifier (not shown) can be connected to the input terminals 1, 3 (FIG. 1A), after which the rectified mains voltage is smoothed by the input capacitor 5. In that case the auxiliary voltage $V_x$ can again be derived from a battery, but the solution shown in FIG. 1A is more elegant. The auxiliary voltage source therein is formed by the already described combination of the second capacitor 45, the third rectifier element 47 and the tap 49 of the first coil 9. The tap 49 is situated approximately halfway the first coil 9, so that the voltage $V_x$ across the second capacitor 45 is approximately equal to half the voltage $V_i$ across the input capacitor 5.

FIG. 4 shows a second embodiment of the power supply apparatus in accordance with the invention; FIG. 4A is analogous to FIG. 1A and FIG. 4B shows a circuit diagram analogous to FIG. 1B. Corresponding parts are denoted by corresponding reference numerals. In the circuit diagram of FIG. 4B, the auxiliary voltage source 55 is arranged between the negative terminal of the power supply battery 53 and the second coil 35. Analogous to the situation in the first embodiment, the voltage at the junction 43 again equals at least $V_i$ in the closed state of the switching element 11. The voltage at the junction 41, however, now at the most equals $V_i$ because the second rectifier element 39 starts to conduct in the case of a higher voltage. This means that just before the closing of the switching element 11 the voltage $V_C$ is equal to or lower than 0 V. As soon as the switching element 11 is closed, $V_{43}$ becomes 0 V. Because $V_C \leq 0$ V, $V_{41} \leq V_{43}$, so that $V_{41} \leq 0$ V as soon as the switching element 11 is closed. Thus, a voltage at least equal to $V_x$ is then present across the second coil 35, which means that an oscillation of an amplitude at least equal to $V_x$ occurs between the second coil and the first capacitor 31. The voltage at the junction 41 will, consequently, increase from 0 V to at least 2 $V_x$. The voltage across the first capacitor 31, therefore, then equals $-2 V_x$. This means that the voltage jump across the switching element will again amount to $V_i - 2 V_x$. If the value of $V_x$ equals ½$V_i$, the voltage across the switching element 11 will thus be zero again upon switching off. Therefore, the effect will be the same as in the first embodiment.

In the circuit diagram shown in FIG. 4B, the auxiliary voltage source 55 is formed by a battery like in FIG. 1B. FIG. 4A shows a diagram of a practical embodiment in which the auxiliary voltage source comprises a third coil 65 which is connected between the negative input terminal 3 and the second coil 35. The third coil 65 is magnetically coupled to the first coil 9, for example in that both coils are wound on the same soft-magnetic core. This core may be formed, for example by the core of the transformer 13. The coupling between the third coil 65 and the first coil 9 is chosen so that a voltage pulse of given polarity with respect to the input terminals 1, 3 in the first coil induces a voltage pulse of the same polarity in the third coil. This is denoted in a conventional manner by means of dots near said coils in FIG. 4A. The polarity of a voltage pulse induced in the secondary coil 15 of the transformer 13 is indicated analogously. The number of turns of the third coil 65 amounts to approximately half the number of turns of the first coil 9, so that the value of the voltage induced in the third coil amounts to approximately half the value of the input voltage.

The auxiliary voltage source is provided at one of the two extremities of the second series connection 33 in both embodiments described. This is the simplest solution from a connection technical point of view. However, it is also possible to arrange the auxiliary voltage source in a different position within the second series connection 33.

We claim:

1. A power supply apparatus for converting an electric DC voltage, acting as an input voltage, into an output voltage, comprising positive and negative input terminals (1, 3) which are arranged to receive the input voltage, a first series connection (7) of at least a first coil (9) and a controllable switching element (11) which series connection interconnects the input terminals, and a limiter circuit (29) which comprises a first capacitor (31) and a second series connection (33) of at least a second coil (35), a first rectifier element (37) and a second rectifier element (39), which second series connection is connected parallel to the first series connection in such a manner that the cathodes of the first and the second rectifier elements are oriented towards the positive input terminal (1), an electrode of the first capacitor being connected to the anode of the second rectifier element whereas the other electrode is connected to the junction (43) of the first coil and the switching element, characterized in that the second series connection (33) also comprises an auxiliary voltage source (55) which is arranged to supply a DC voltage amounting to approximately half the input voltage, its positive pole being oriented towards the positive input terminal (1).

2. A power supply apparatus as claimed in claim 1, characterized in that the auxiliary voltage source (55) is situated at one of the two extremities of the second series connection (33).

3. A power supply apparatus as claimed in claim 2, characterized in that the auxiliary voltage source (55) comprises a second capacitor (45) which is connected between the cathode of the second rectifier element (39) and the positive input terminal (1), the electrode of said second capacitor which is connected to the cathode of the second rectifier element also being connected to the anode of a third rectifier element (47) whose cathode is connected to a tap (49) of the first coil (9) which is situated approximately halfway the first coil.

4. A power supply apparatus as claimed in claim 2, characterized in that the auxiliary voltage source (55) comprises a third coil (65) which is connected between the negative input terminal (3) and the second coil (35) and which is magnetically coupled to the first coil (9) in such a manner that a voltage pulse of given polarity relative to the input terminals (1, 3), in the first coil induces a voltage pulse of the same polarity in the third coil, the number of turns of the third coil amounting to approximately half the number of turns of the first coil.

* * * * *